(12) United States Patent
Martchovsky

(10) Patent No.: US 8,581,668 B2
(45) Date of Patent: Nov. 12, 2013

(54) OSCILLATOR REGENERATION DEVICE

(75) Inventor: Andrey Martchovsky, Fremont, CA (US)

(73) Assignee: Analog Devices, Inc., Norwood, MA (US)

( * ) Notice: Subject to any disclaimer, the term of this patent is extended or adjusted under 35 U.S.C. 154(b) by 34 days.

(21) Appl. No.: 13/331,553

(22) Filed: Dec. 20, 2011

(65) Prior Publication Data

US 2013/0154750 A1    Jun. 20, 2013

(51) Int. Cl.
*H03K 3/03* (2006.01)

(52) U.S. Cl.
USPC .................. 331/57; 331/96; 331/107 SL

(58) Field of Classification Search
USPC .................................. 331/57, 96, 107 SL
See application file for complete search history.

(56) References Cited

U.S. PATENT DOCUMENTS

| | | | |
|---|---|---|---|
| 5,302,920 A | 4/1994 | Bitting | |
| 5,584,067 A | 12/1996 | Buer et al. | |
| 5,592,126 A | 1/1997 | Boudewijns et al. | |
| 5,652,549 A | 7/1997 | Unterricker et al. | |
| 5,825,211 A | 10/1998 | Smith et al. | |
| 5,945,847 A | 8/1999 | Ransijn | |
| 6,002,274 A | 12/1999 | Smith et al. | |
| 6,150,886 A | 11/2000 | Shimomura | |
| 6,157,037 A | 12/2000 | Danielson | |
| 6,259,747 B1 | 7/2001 | Gustafsson et al. | |
| 6,281,759 B1 | 8/2001 | Coffey | |
| 6,323,737 B1 | 11/2001 | Broekaert | |
| 6,396,359 B1 | 5/2002 | Hajimiri et al. | |
| 6,426,662 B1 | 7/2002 | Arcus | |
| 6,556,089 B2 | 4/2003 | Wood | |
| 6,566,968 B2 | 5/2003 | Aghahi | |
| 6,781,424 B2 | 8/2004 | Lee et al. | |
| 6,856,208 B2 | 2/2005 | Lee et al. | |
| 6,870,431 B2 | 3/2005 | Afghahi | |
| 6,900,699 B1 | 5/2005 | Kim | |
| 6,943,599 B2 | 9/2005 | Ngo | |
| 6,995,620 B2 | 2/2006 | Afghahi | |
| 7,005,930 B1 | 2/2006 | Kim et al. | |
| 7,085,668 B2 | 8/2006 | Johnson | |
| 7,088,154 B2 | 8/2006 | Ngo | |
| 7,091,802 B2 | 8/2006 | Ham et al. | |
| 7,130,604 B1 | 10/2006 | Wong et al. | |
| 7,218,180 B2 | 5/2007 | Wood | |

(Continued)

FOREIGN PATENT DOCUMENTS

WO    WO 01/89088 A1    11/2001

OTHER PUBLICATIONS

Wood et al., *Rotary Traveling-Wave Oscillator Arrays: A New Clock Technology*, IEEE Journal of Solid-State Circuits, vol. 36, No. 11, Nov. 2001, 12 pages.

(Continued)

*Primary Examiner* — Arnold Kinkead
(74) *Attorney, Agent, or Firm* — Knobbe Martens Olson & Bear LLP

(57) ABSTRACT

A negative resistance device for a multiphase oscillator is disclosed. The negative resistance device is coupled to taps of the multiphase oscillator so that it injects no energy into the oscillator when the oscillator is most sensitive to noise, thereby decreasing the phase noise of the oscillator. The negative resistance device also guarantees the direction of movement of a traveling wave past the taps of the multiphase oscillator.

14 Claims, 7 Drawing Sheets

(56) References Cited

U.S. PATENT DOCUMENTS

| | | | |
|---|---|---|---|
| 7,224,199 B1 | 5/2007 | Kang | |
| 7,224,235 B2 | 5/2007 | De Ranter et al. | |
| 7,236,060 B2* | 6/2007 | Wood | 331/57 |
| 7,242,272 B2 | 7/2007 | Ham et al. | |
| 7,274,262 B2 | 9/2007 | Ham et al. | |
| 7,295,076 B2 | 11/2007 | Kim et al. | |
| 7,307,483 B2 | 12/2007 | Tzartzanis et al. | |
| 7,315,219 B2 | 1/2008 | Chiang | |
| 7,339,439 B2 | 3/2008 | Roubadia et al. | |
| 7,378,893 B1 | 5/2008 | Kang | |
| 7,397,230 B2 | 7/2008 | Tabaian et al. | |
| 7,409,012 B2 | 8/2008 | Martin et al. | |
| 7,446,578 B2 | 11/2008 | Huang | |
| 7,471,153 B2 | 12/2008 | Kee et al. | |
| 7,482,884 B2 | 1/2009 | Wang et al. | |
| 7,504,895 B2 | 3/2009 | Neidorff | |
| 7,511,588 B2 | 3/2009 | Gabara | |
| 7,513,873 B2 | 4/2009 | Shifrin | |
| 7,515,005 B2 | 4/2009 | Dan | |
| 7,541,794 B2 | 6/2009 | Tabaian et al. | |
| 7,545,225 B2 | 6/2009 | Beccue | |
| 7,551,038 B2 | 6/2009 | Jang et al. | |
| 7,571,337 B1 | 8/2009 | Zhai et al. | |
| 7,577,225 B2 | 8/2009 | Azadet et al. | |
| 7,609,756 B2 | 10/2009 | Wood | |
| 7,612,621 B2 | 11/2009 | Kim et al. | |
| 7,616,070 B2 | 11/2009 | Tzartzanis et al. | |
| 7,656,239 B2 | 2/2010 | Bietti et al. | |
| 7,656,336 B2 | 2/2010 | Wood | |
| 7,656,979 B2 | 2/2010 | Leydier et al. | |
| 7,663,328 B2 | 2/2010 | Gonder | |
| 7,715,143 B2 | 5/2010 | Bliss et al. | |
| 7,741,921 B2 | 6/2010 | Ismailov | |
| 7,782,988 B2 | 8/2010 | Ziesler | |
| 7,833,158 B2 | 11/2010 | Bartz | |
| 7,847,643 B2 | 12/2010 | Da Dalt | |
| 7,885,625 B2 | 2/2011 | Muhammad et al. | |
| 7,893,778 B2 | 2/2011 | Mohtashemi et al. | |
| 7,907,023 B2 | 3/2011 | Liang et al. | |
| 7,911,284 B2 | 3/2011 | Kuwano | |
| 7,924,076 B2 | 4/2011 | Suzuki et al. | |
| 7,936,193 B2 | 5/2011 | Van Der Wel et al. | |
| 7,944,316 B2 | 5/2011 | Watanabe et al. | |
| 7,952,439 B1 | 5/2011 | Heggemeier et al. | |
| 7,973,609 B2 | 7/2011 | Ohara et al. | |
| 7,995,364 B2 | 8/2011 | Shiu | |
| 8,008,981 B2 | 8/2011 | Hong et al. | |
| 8,049,563 B2 | 11/2011 | Aoki et al. | |
| 8,089,322 B2 | 1/2012 | Martchovsky et al. | |
| 8,169,267 B2 | 5/2012 | Le Grand De Mercey | |
| 8,410,858 B2 | 4/2013 | Wood | |
| 2005/0225365 A1 | 10/2005 | Wood | |
| 2006/0208776 A1 | 9/2006 | Tonietto et al. | |
| 2008/0074202 A1 | 3/2008 | Gabara | |
| 2009/0322394 A1 | 12/2009 | Song et al. | |
| 2010/0117744 A1 | 5/2010 | Takinami et al. | |
| 2010/0156549 A1 | 6/2010 | Uemura et al. | |
| 2010/0321121 A1 | 12/2010 | Mohtashemi | |
| 2011/0095833 A1 | 4/2011 | Mohtashemi et al. | |
| 2011/0156760 A1 | 6/2011 | Bhuiyan et al. | |
| 2011/0156773 A1 | 6/2011 | Beccue | |
| 2011/0195683 A1 | 8/2011 | Brekelmans et al. | |
| 2011/0286510 A1 | 11/2011 | Levantino et al. | |
| 2012/0008717 A1 | 1/2012 | van Sinderen et al. | |
| 2012/0013363 A1 | 1/2012 | Takinami et al. | |
| 2012/0013407 A1 | 1/2012 | Takinami et al. | |
| 2012/0025918 A1 | 2/2012 | Wang et al. | |
| 2012/0319783 A1 | 12/2012 | Martchovsky et al. | |

OTHER PUBLICATIONS

International Search Report and Written Opinion of the International Searching Authority in PCT application No. PCT/US2012/067630, dated Mar. 26, 2013, 11 pages.

* cited by examiner

OSCILLATOR REGENERATION DEVICE

CROSS-REFERENCE TO RELATED APPLICATIONS

1. Field of the Invention

The present invention relates generally to multiphase oscillators and more specifically to active devices that maintain the oscillation of such oscillators.

2. Description of the Related Art

Most electronic systems encounter noise from several sources, such as shot noise, thermal noise, and flicker noise, which usually arise from currents flowing in the electronic system.

Most electronic systems include one or more oscillators, which provide the clocks that pace or operate the system. Because oscillators are linear, time-varying (LTV) systems, electronic noise has unusual effects on oscillators. One way to characterize these effects is to determine the LTV unit impulse response $h_\phi$ for the oscillator. This function $h_\phi$ includes a key function called the impulse sensitivity function (ISF) $\Gamma(\omega_0 \tau)$, which captures the essential information about the oscillator and allows one to compute the oscillator's response to a phase impulse. The ISF for an oscillator shows that the various noise sources mentioned above give rise to phase $\phi(t)$ modulation $\cos[\omega_0 t + \phi(t)]$ of the oscillator frequency $\omega_0$, which appears as a spectral "skirt" about the oscillator frequency $\omega_0$. This spectrum, actually a power spectral density $\mathcal{L}_{phase}(\Delta\omega)$, is usually separated into three regions. The region nearest the oscillator frequency is the $1/f^3$ region. At some point $\omega_{1/f}$ (the $1/f$ noise corner), this region breaks into a $1/f^2$ region, which continues until it reaches the noise floor of the system, which is a flat region at frequencies far distant from the oscillator frequency.

Using the ISF, the power spectral density (PSD) for an oscillator in the $1/f^2$ region can be shown to be $$\mathcal{L}_{phase}(\Delta\omega) = 10\log\left(k\frac{\Gamma_{rms}^2}{\delta\omega^2}\frac{\overline{i_n^2}}{\Delta f}\right) \text{ where } \frac{\overline{i_n^2}}{\Delta f}$$

is the power spectral density of the noise, $\Gamma_{rms}$ is rms value of the ISF, and $\Delta\omega$ is the offset frequency from the oscillator nominal frequency. The PSD for an oscillator in the $1/f^3$ region is $$\mathcal{L}_{Phase}(\Delta\omega) = 10\log\left(kc_0^2\frac{\omega_{1/f}}{\Delta\omega^3}\frac{\overline{i_n^2}}{\Delta f}\right),$$

where now the ISF is included in the $c_0$ term. These formulae for the power of the sidebands about the oscillator frequency indicate that there are both up and down frequency translations of circuit noise currents $i_n$ into noise near the oscillator frequency. The $1/f^2$ region results from down-converted white noise at integer multiples of the oscillator frequency and the $1/f^3$ region results from up-converted $1/f$ circuit noise. The $1/f$ noise is particularly troublesome for some applications, but the presence of the $c_0$ term (the dc term) in the PSD function suggests that to minimize this noise, one should make the term as small as possible. One way of doing this is to arrange the circuitry so that disturbances during the rising edge in the oscillation are the same as those during the falling edge, thereby making the net disturbances over the cycle almost cancel out.

Not only does the oscillator itself have a time-varying characteristic, but the oscillator can be subject to time-varying noise sources that vary in a periodic fashion. In fact, in a full analysis, another function called a noise modulating function (NMF) $\alpha(\omega_0 t)$ modifies the ISF to create an effective ISF ($ISF_e$) that accounts for periodic time-varying noise. As with the other noise sources, one should attempt to find circuit topologies that minimize the effect of time-varying noise. One way to minimize the noise is to arrange circuitry so that time-varying noise sources have their maximum power at the minimum sensitivity point in the oscillator waveform.

Rotary wave oscillators are a particular type of oscillator, operating by means of a wave that travels in a closed loop that reverses the phase of the wave on every transit of the loop. FIG. 1 illustrates this type of oscillator. The direction of the traveling wave around the closed loop can be either clockwise or counter clockwise unless some technique sets the direction of rotation. Such oscillators have the advantage that multiple phases are available by physically tapping the oscillator. However, for the taps to be useful, the one must know the direction of the wave along the taps. It is thus desirable to have control over the direction of the traveling wave.

In summary, it is desirable to have an oscillator with low phase noise to make it useful in a great variety of applications and it is desirable, in the case of a rotary wave oscillator, to control the direction of travel of the wave.

BRIEF SUMMARY OF THE INVENTION

An embodiment of the present invention is an amplifier for generating and maintaining a traveling wave on a RTWO. The amplifier is connected to the phases of the RTWO such that it turns off at the critical time when noise would otherwise be injected into the oscillator.

One of the advantages of the present invention is that it eliminates crowbar current. In particular, the dwell time of the amplifier eliminates crowbar current, which flows from supply to ground, thereby contributing noise power but not energy to the oscillator.

Another advantage is that it enforces the wave direction of oscillator of a rotary traveling wave oscillator.

Yet another advantage is that, with proper location of the amplifier phase taps, it reduces the sensitivity of an RTWO due to process variations.

The present invention thus reduces phase noise and provides a means for controlling the direction of the traveling wave in the oscillator.

BRIEF DESCRIPTION OF THE DRAWINGS

These and other features, aspects and advantages of the present invention will become better understood with regard to the following description, appended claims, and accompanying drawings where:

DETAILED DESCRIPTION OF THE INVENTION

Figure 1:
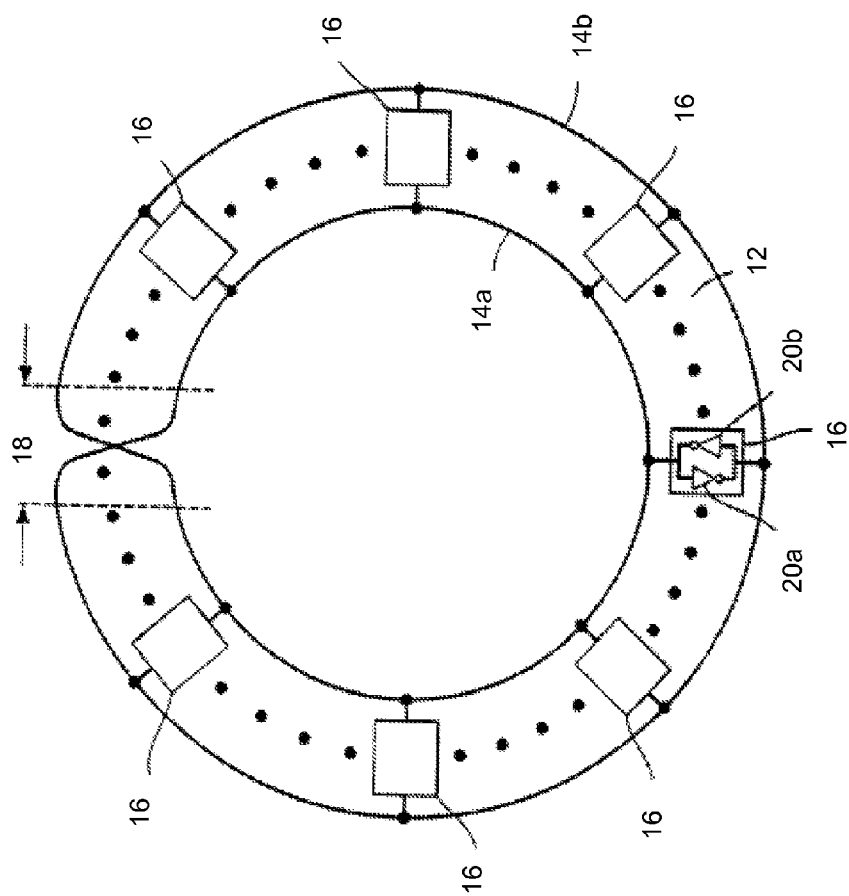
FIG. 1 shows a prior art rotary oscillator.

FIG. 1 shows a prior art rotary oscillator 10. The oscillator 10 includes a pair of conductors 14a,b connected to form a closed loop 12, an odd number of cross-overs 18 that reverse the phase of a wave traveling on the conductors 14a,b, and a plurality of regeneration devices 16 (of which 20a,b is one of many implementations) that create and maintain the traveling wave. Each of the regeneration devices 16 has negative resistance and operates to add energy to the traveling wave as it passes a device. For example, if the wave is traveling clockwise with a positive voltage on conductor 14b and has not reached 20a,b, then the regeneration device 20a,b has a polarity opposite to the approaching wave. As the wave passes the regeneration device 20a,b, the wave changes the state of the device 20a,b so that it has the same polarity as the wave, thereby adding energy to and reinforcing the wave.

Any negative resistance device that operates to add energy to the traveling wave will meet the requirements of a regeneration device for the rotary oscillator.

Figure 2B:
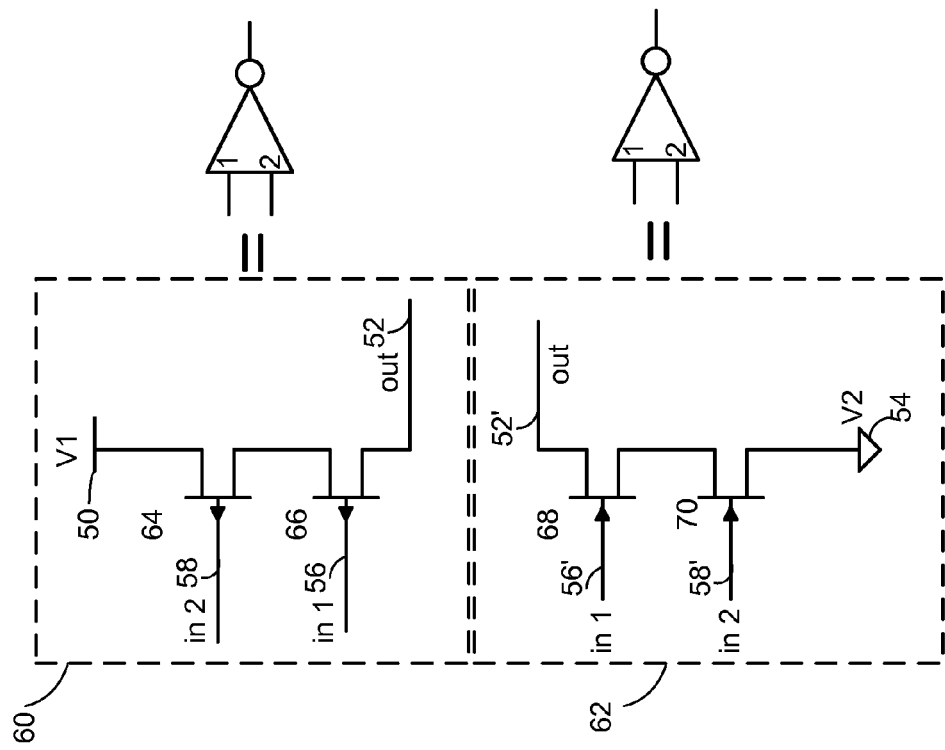
FIG. 2B shows an alternate version of the amplifier for use in an embodiment of the present invention.
Figure 2A:
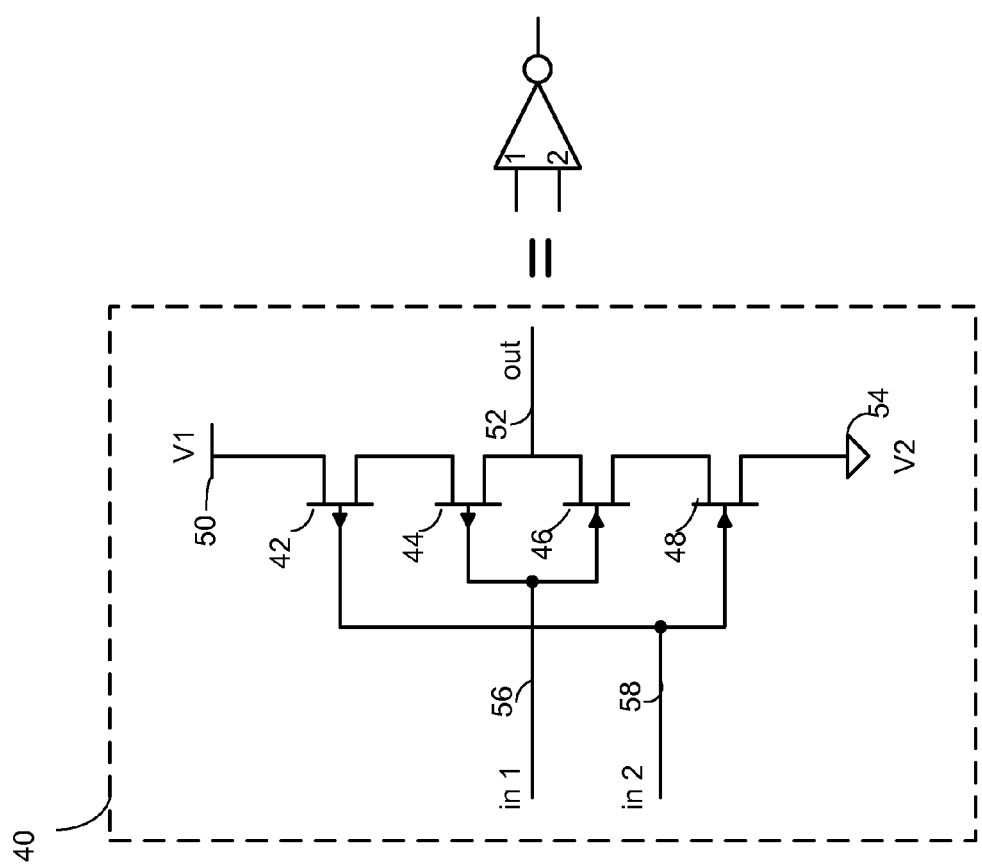
FIG. 2A shows an amplifier for use in an embodiment of the present invention in which the amplifier is the negative resistance device.

FIG. 2A shows an amplifier 40 for use in an embodiment of the present invention in which the amplifier is the negative resistance device. In the version shown in FIG. 2A, the amplifier 40 includes first 42 and second 44 p-channel transistors and first 46 and second 48 n-channel transistors. The p-channel transistors 42, 44 have their channels connected in series and between a first supply voltage V1 50 and the output out 52. The n-channel transistors 46,48 have their channels connected in series between a second supply voltage V2 54 and the output out 52. The gates of the second p-channel transistor 44 and the first n-channel transistor 46 are connected to a first input, in1 56. The gates of the first p-channel transistor 42 and the second n-channel transistor 48 are connected to a second input, in2 58.

FIG. 2B shows an alternate version 60, 62 of the amplifier for use in an embodiment of the present invention. In the alternate version, the amplifier 62 at one position on the loop comprises two p-channel transistors 64, 66 whose channels connected in series between the first supply voltage V1 50 and the output 52. The gate of one transistor is connected to the first input in1 56 and the gate of the other transistor is connected to the second input in2 58. At an adjacent position on the loop, up or downstream, the amplifier comprises two n-channel transistors 68, 70 whose channels are connected in series between the output 52' and the second supply voltage V2 54. The gate of one transistor is connected to the first input in1 56' and the gate of the other transistor is connected to the second input in2 58'. These two configurations thus alternate at each position on the loop, so that the traveling wave first encounters, say a p-channel amplifier 60, then an n-channel amplifier 62, and then a p-channel amplifier 60. When the wave encounters a p-channel amplifier 60 it receives a boost that increases the wave's higher potential. When the wave encounters an n-channel amplifier 62, it receives a boost that increases the waves' lower potential.

Operation of FIG. 2A

Figure 3:
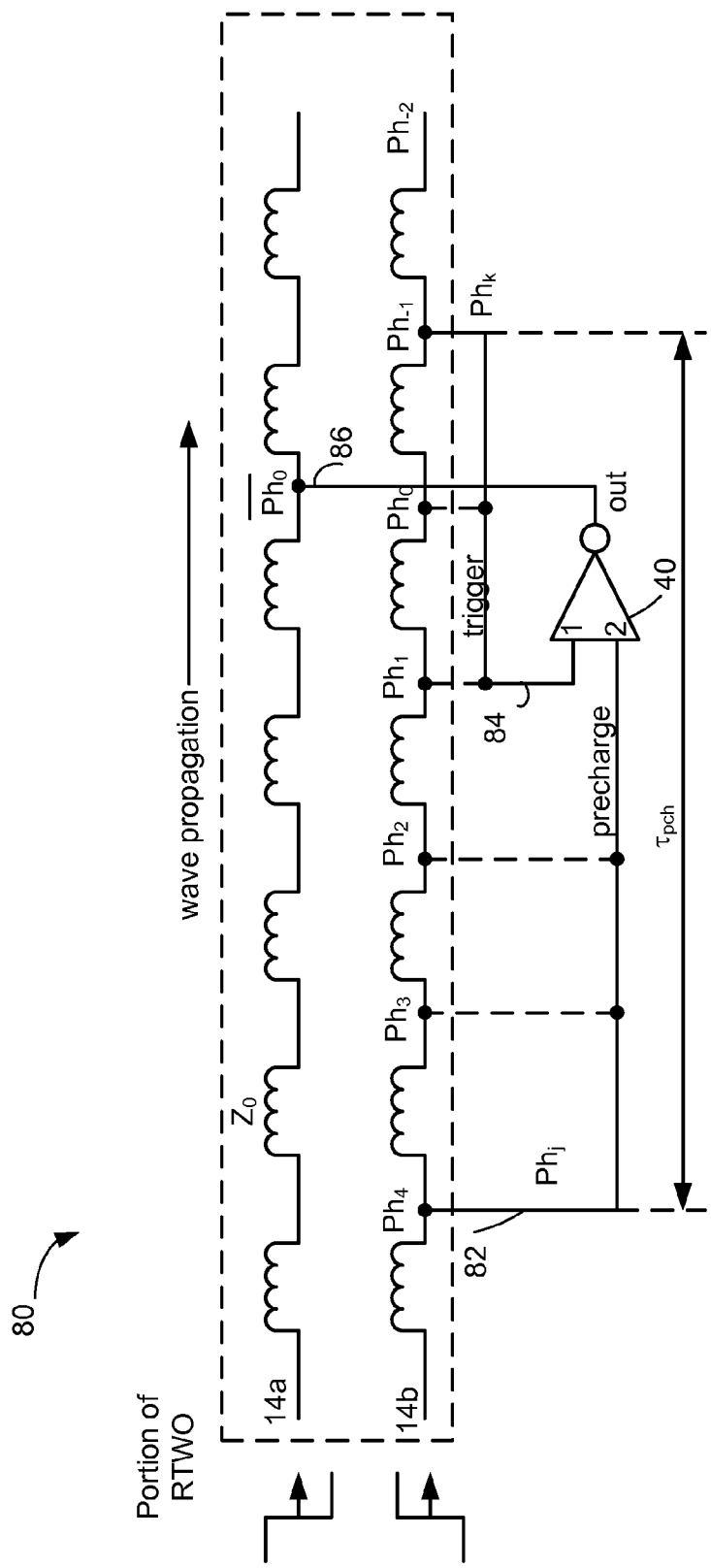
FIG. 3 shows a portion of the transmission line on which a wave travels from left to right in the figure.

FIG. 3 shows a portion of the transmission line 14a, 14b (in FIG. 1), on which a wave travels from left to right in the figure. Amplifier 40 has input 1 and input 2 connected to different positions $Ph_j$ 84, $Ph_k$ 82 on conductor 14b and its output connected to a position $\overline{Ph_0}$ 86 on conductor 14a. The amplifier embodiment 40 in FIG. 2A operates as follows, adopting the convention that positive j and k values lag the wave front, while negative values lead it. If the wave front of a wave traveling in the direction from j to k is at $Ph_0$, then the wave front arrives at $Ph_j$ before it arrives at $Ph_k$. Before the wave arrives at $Ph_j$ or $Ph_k$ on the RTWO, input 1 and input 2 are relative low voltages compared to their complementary voltages on the other conductor of the RTWO. This means that both p-channel transistors are on, sourcing current from the first supply voltage V1 to the output 86, which is at a voltage that is relatively high.

When a positive-going wave front $V(Ph_j)$ arrives the $Ph_j$ point 82 on the RTWO, input 2 of the amplifier 40 goes positive first. This causes one of the p-channel transistors (42 in FIG. 2A) in the amplifier 40 to turn OFF, and one of the n-channel transistors (48 in FIG. 2A) to turn ON. Because now there is no pair of transistors in amplifier 40 connected between a supply voltage, V1 or V2, and the output 52, the output 52 is in a high-impedance state, neither sourcing nor sinking current to the RTWO at position 86.

When the positive-going wave front $V(Ph_k)$ arrives at the $Ph_k$ point 84 on the RTWO, now input 1 of the amplifier goes positive. This has the effect of turning ON both n-channel transistors (46, 48 in FIG. 2A) and turning OFF both p-channel transistors (42, 44 in FIG. 2A). The output of the amplifier $V(\overline{Ph_0})$ now sinks current to the second supply voltage V2, which reinforces the negative-going wave front at the point 86 ($\overline{Ph_0}$) on the RTWO to which the output of the amplifier 40 is connected.

Conversely, if we assume that the output of the amplifier is at a relative low voltage, then both n-channel transistors (46, 48 in FIG. 2A) are ON, sinking current from output 52 to the second supply voltage V2. Under this condition, both in1 and in2 are relatively positive. When a negative-going wave front arrives at the $Ph_j$ point 82 on the RTWO, input 2 of the amplifier 40 goes relatively low. This causes one of the n-channel transistors (48 in FIG. 2A) to turn OFF and one of the p-channel transistors (42 in FIG. 2A) to turn ON. Because there is no pair of transistors connected between a supply voltage and the output, the output 52 is in a high-impedance state, neither sourcing nor sinking current to the RTWO at position 86. When the negative-going wave front arrives at the $Ph_k$ point 84 on the RTWO, input 1 goes relatively low, causing both n-channel transistors (46, 48 in FIG. 2A) to turn OFF and both p-channel transistors (42, 44 in FIG. 2A) to turn ON, thereby sourcing current from the first supply voltage V1 to the output 52. Again, this reinforces the positive-going wave front at the point 86 on the RTWO to which the output of the amplifier 52 is connected.

Figure 4A:
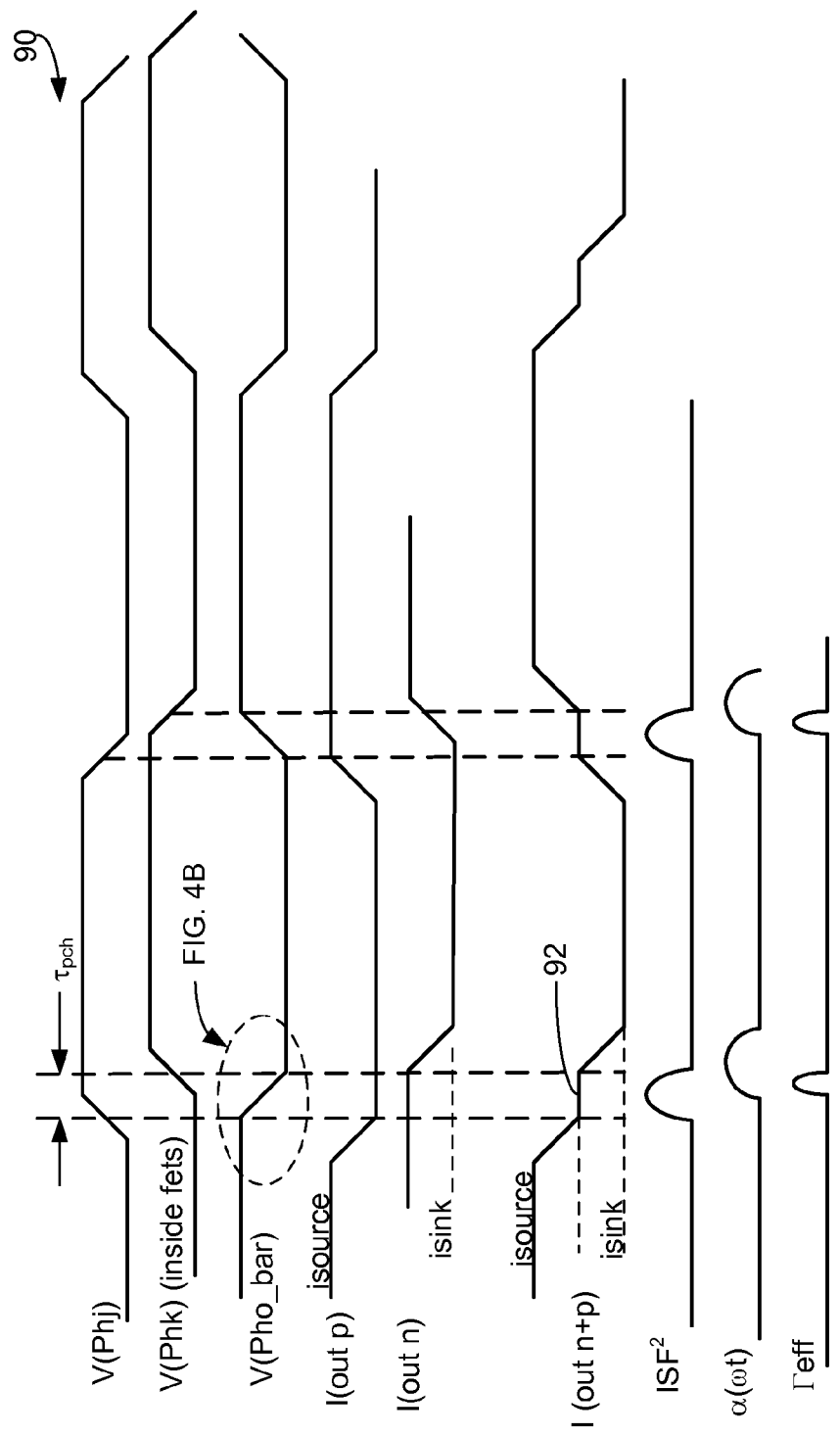
FIG. 4A shows a timing diagram of the various waveforms involved in the present invention.

FIG. 4A shows a timing diagram of the various waveforms involved. V(Phj) is the waveform of a positive-going wave at Phj, V(Phk) is a positive going wave a Phk, and V(Ph0) is the output of the amplifier 40 at position 86 in FIG. 3. I(out p) is the output current through the p-channel transistors (42, 44 in FIG. 2A) and I(out n) is the output current through the n-channel transistors (46, 48 in FIG. 2A). I(out n+p) is the resultant output current from the amplifier 40. $ISF^2$ is the impulse sensitivity function, $\alpha(\omega t)$ is the cyclostationary noise function, and Γeff is the effective impulse sensitivity function. As is clear from the timing diagram, the output of the amplifier I(out n+p) has a dwell time $\tau_{pch}$ 92, which separates the time when the amplifier 40 is sourcing current from the time when the amplifier 40 is sinking current. It is the time when the amplifier 40 is in the high impedance state. It is also clear that the time when the amplifier 40 is in the high impedance state aligns with the $ISF^2$ for the oscillator, which is the time when the oscillator is most sensitive to phase noise. Therefore, arranging the inputs of the amplifier 40 to create a dwell time 92 reduces the phase noise of the oscillator, because it reduces the energy input to the oscillator during the time when the oscillator is most sensitive. The size of the cyclostationary noise source is also minimized, resulting in a lower effective ISF.

Figure 4B:
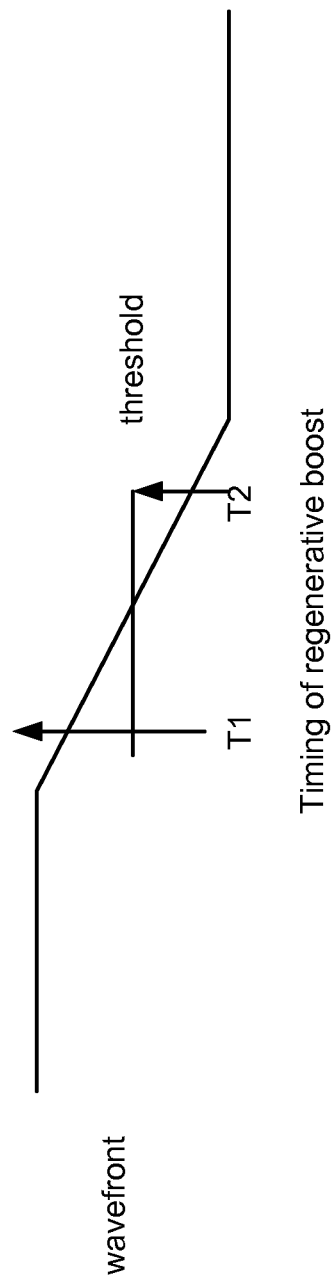
FIG. 4B, the inset in FIG. 4A, illustrates the negative-going wave front and two times T1 and T2 at which the amplifier output impacts the wave front.

The size of the delay or dwell time $\tau_{pch}$ ($Ph_j-Ph_k$) is adjustable, as shown in FIG. 3. The tap for $Ph_j$ can be adjusted from $Ph_4$, to $Ph_3$, to $Ph_2$ while the tap for $Ph_k$ can be adjusted to $Ph_{-1}$ to $Ph_0$, to $Ph_1$. To be most effective in reducing noise, the time difference $\tau_{pch}$ between $Ph_j$ and $Ph_k$ should be on the order of the output transition time or rise and fall time of the wave front on the oscillator. This allows precise alignment of the amplifier's switching with the transition of the wave front at $\overline{Ph_0}$. In fact, the goal here is to arrange the input connections so that the amplifier switches at a desirable point on the transition of the wave front at $\overline{Ph_0}$. FIG. 4B, the inset in FIG. 4A, illustrates the negative-going wave front and two instants in time T1 and T2 at which the amplifier output can be designed to switch. Time T1 is at a time above a detection threshold of the wave front and occurs when the amplifier switches after the wave front has passed $Ph_0$. Time T2 is a time below the detection threshold and occurs when the amplifier switches before or at the time the wave front passes $Ph_0$. It is preferable to impact the negative-going wave front at a time T1, which means that it is preferable to connect the in1 input of the amplifier to a point $Ph_k$ after $Ph_0$. This permits the oscillator to run at its natural oscillation frequency, which is that determined only by the transmission line. If the in1 input is connected to a point before $Ph_0$ so that the switching of the amplifier occurs at T2, i.e., before $Ph_0$, the oscillator is forced off its natural oscillation frequency, which consumes more power, and raises the noise floor.

Operation of FIG. 2B

The amplifiers in FIG. 2B operate in a fashion similar to those of FIG. 2A, except that the wave front encounters the p-type amplifier 60 in FIG. 2B and the n-type amplifier 62 in FIG. 2B at different times. In particular, for the p-type amplifier 60 when a positive-going wave front approaches input 2, the amplifier 60 goes to a high impedance state. When the positive-going wave front reaches input 1, amplifier 60 is shut off, thereby preventing any boost to the negative-going wave on conductor 14a when it reaches position 86 in FIG. 3. The wave then continues to the next amplifier, which is now an n-type amplifier 62 in FIG. 2B. When the positive-going wave reaches input 2, amplifier 62 is enabled and when the wave reaches input 1, amplifier 62 is turned ON, thereby sinking current on the negative-going wave front traveling on conductor 14a. This means that there are times during the traveling of the wave when a positive-going wave front is not reinforced, while the negative-going wave front is a short time later and vice-versa. An advantage of the configuration of FIG. 2B is that the capacitive load of the RTWO is reduced, thereby reducing RTWO power consumption. The configuration also simplifies the layout wiring of the RTWO.

Direction Control

Figure 5A:
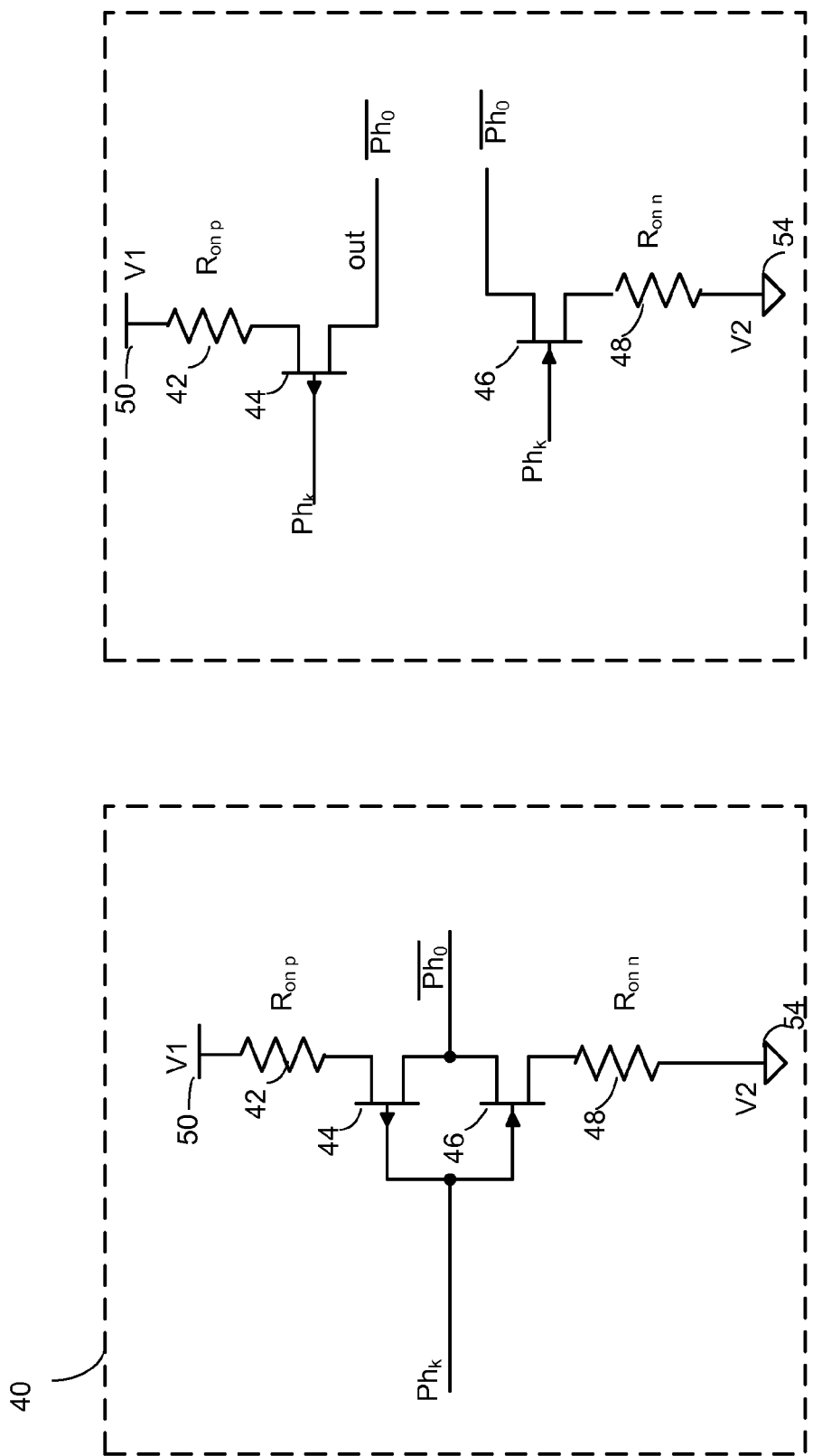
FIG. 5A shows an equivalent circuit for the amplifier of FIG. 2A when a wave travels in the preferred direction.

To encourage a wave front to travel in a preferred direction, an additional constraint must be imposed on the amplifiers' input connections. In particular, if the input connections are subjected to a constraint that input 2 is reached before input 1 and $|Ph_j-Ph_0|>|Ph_k-Ph_0|$, then the wave front propagation from $Ph_j$ to $Ph_k$ in FIG. 3 is encouraged, while a wave in the reverse direction is discouraged. FIG. 5A shows an equivalent circuit for the amplifier of FIG. 2A when a wave travels in the preferred direction. Having the positive difference between $Ph_j$ and $Ph_0$ larger than that between $Ph_k$ and $Ph_0$ provides sufficient time for the p-channel and n-channel transistors 42, 48 shown in FIG. 5A connected to the first V1 and second V2 supply voltages to reach very low resistance (resistance in the triode or linear region ($R_{pON}$, $R_{nON}$)) by the time the wave front reaches input 1, after first passing input 2. When the wave front reaches input 1, the amplifier 40 then switches with maximum gain to maximally boost the wave.

Figure 5B:
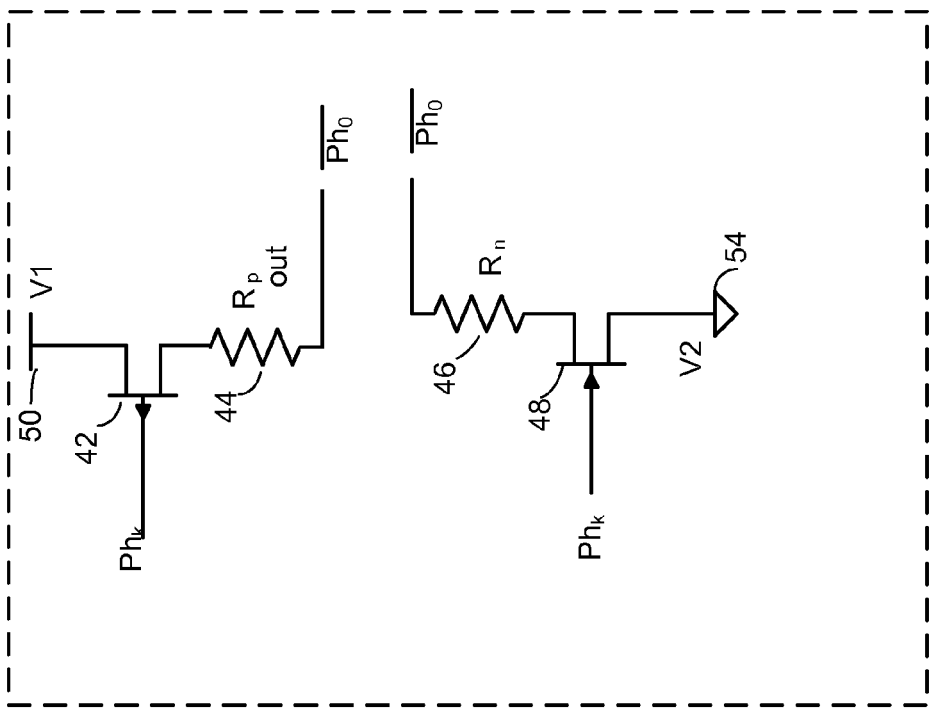
FIG. 5B shows an equivalent circuit for the amplifier of FIG. 2A when a wave travels opposite to the preferred direction.
Figure 5B:
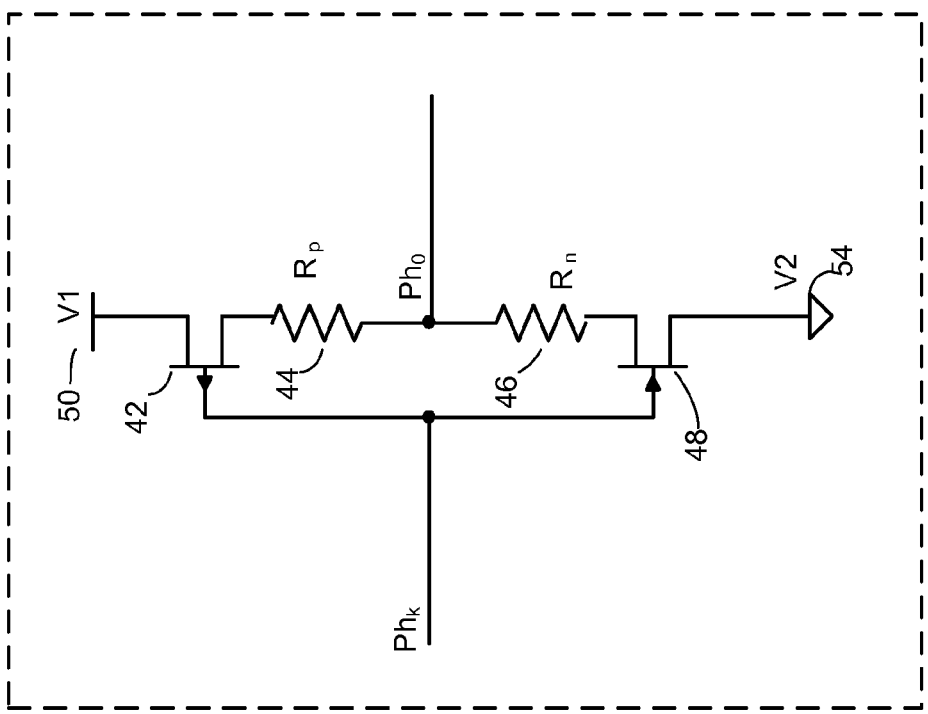

FIG. 5B shows an equivalent circuit for the amplifier of FIG. 2A when a wave travels opposite to the preferred direction. A wave front traveling in the reverse direction, upon reaching input 1 first, would turn ON the transistors in the amplifier 44, 46 connected to the output $Ph_0$, as shown in FIG. 5B. However, these transistors 44, 46 have high resistance Rp, Rn due to their position in the amplifier. When the wave front reaches input 2, the amplifiers switch but with gain insufficient to maintain the wave. Therefore, waves traveling in the direction shown in FIG. 3 are encouraged and waves traveling in the opposite direction are discouraged.

Although the present invention has been described in considerable detail with reference to certain preferred versions thereof, other versions are possible. Therefore, the spirit and scope of the appended claims should not be limited to the description of the preferred versions contained herein.

What is claimed is:

1. A multiphase oscillator comprising:
one or an odd number of means for reversing a polarity of a wave traveling thereon;
a pair of conductors arranged to form a closed loop when coupled with the polarity reversing means such that the wave traveling between the conductors imparts a first polarity between the conductors after a first traversal of the closed loop and a second polarity after a second traversal of the loop, wherein the pair of conductors comprises a first conductor and a second conductor; and
a plurality of regeneration devices, each said regeneration device connected between the pair of conductors of the closed loop at a particular position on the loop and having an output that matches the polarity between the conductors at the position of the regeneration device after a traveling wave has passed the position, each said regeneration device having an output that transitions as the traveling wave is passing the position of the device, said transition including a dwell time during which the device output neither sources nor sinks current,
wherein a first regeneration device of the plurality of regeneration devices comprises a first input, a second input, an output, and at least two transistors electrically connected in series, wherein the first and second inputs are connected to different positions on the first conductor, and wherein the output of the first regeneration device is connected to the second conductor,
wherein the output of the first regeneration device is in a high-impedance state during the dwell time.

2. The oscillator according to claim 1, wherein the first regeneration device has a characteristic switching time; and wherein the first input of the first regeneration device is connected to the first conductor at a first position and the second input of the first regeneration device is connected to the first conductor at a second position such that the time for a wave to travel between the first and second positions is approximately equal to the characteristic switching time of the first regeneration device.

3. The oscillator according to claim 1, wherein the first input of the first regeneration device is connected to the first conductor at a first position, the second input of the first regeneration device is connected to the first conductor at a second position, and the output of the first regeneration device is connected to the second conductor at a third position, such that the time for a wave to travel between the first and third position is greater than the time for a wave to travel from the second position to the third position so that the wave is encouraged to travel in a direction from the first position to the third position.

4. The oscillator according to claim 1,
wherein the first regeneration device includes a pair of n-channel transistors and a pair of p-channel transistors; and
wherein each transistor has a gate, a source and, a drain, a channel being present between the source and the drain for conducting current when the gate exceeds a threshold voltage,
wherein the channels of the p-channel transistors are connected in series and between a first supply voltage and the output of the first regeneration device,
wherein the channels of the n-channel transistors are connected in series between a second supply voltage and the output of the first regeneration device,
wherein the gates of the transistors whose drains are connected to the output are connected together and to a first position Phk on the closed loop, wherein the gates of the transistors whose sources are connected respectively to the supply voltages are connected together and to a second position Phj on the closed loop.

5. The oscillator according to claim 1,
wherein the first regeneration device includes a pair of p-channel transistors at a first position on the loop and a pair of n-channel transistors at a second position on the loop adjacent to the first position;
wherein each transistor has a gate, a source and, a drain, a channel being present between the source and the drain for conducting current when the gate exceeds a threshold voltage,
wherein the channels of the p-channel transistors are connected in series between a first supply voltage and the output of the first regeneration device,
wherein the channels of the n-channel transistors are connected in series between a second supply voltage and the output of the first regeneration device,
wherein the gate of the p-channel transistor whose drain is connected to the output is connected to a position Phk on the closed loop, and
wherein the gate of the p-channel transistor whose source is connected to the first supply is connected to a position Phj on the closed loop,
wherein the gate of the n-channel transistor whose drain is connected to the output is connected to a position Phk on the closed loop, and
wherein the gate of the p-channel transistor whose source is connected to the second supply is connected to a position Phj on the closed loop.

6. A method for reducing phase noise in a multiphase oscillator, the method comprising:
providing a plurality of negative resistance devices along a differential transmission line of the oscillator, each supplying energy to the oscillator to maintain oscillations of the oscillator, wherein the differential transmission line is connected in a closed loop, and wherein the differential transmission line comprises a first conductor and a second conductor; and
switching the output of each negative resistance device in synchronism with the oscillations of the oscillator, such that, during the switching, the output has a time in which the negative resistance device neither sources current into nor sinks current from the oscillator, wherein the phase noise of the multiphase oscillator is reduced,
wherein a first negative resistance device of the plurality of negative resistance devices comprises a first input, a second input, an output, and at least two transistors electrically connected in series, wherein the first and second inputs are connected to different positions on the first conductor, and wherein the output of the first negative resistance device is connected to the second conductor,
wherein the output of the first negative resistance device is in a high-impedance state during the dwell time.

7. The method for reducing phase noise according to claim 6, wherein the multiphase oscillator is a rotary wave oscillator; and wherein the plurality of negative resistance devices promotes a particular direction of a traveling wave on the rotary wave oscillator.

8. The method for reducing phase noise according to claim 6, wherein crowbar current in the negative resistance devices is eliminated.

9. The method of claim 6,
wherein the at least two transistors comprise a first p-channel transistor comprising a gate, a source, a drain, and a channel between the source and drain;
wherein the at least two transistors further comprise a second p-channel transistor comprising a gate, a source, a drain, and a channel between the source and drain, wherein the channels of the first and second p-channel transistors are electrically connected in series between the output of the first negative resistance device and a first supply voltage,
wherein the gate of the first p-channel transistor is electrically connected to the first input, and wherein the gate of the second p-channel transistor is electrically connected to the second input.

10. The method of claim 9, further comprising:
a first n-channel transistor comprising a gate, a source, a drain, and a channel between the source and drain; and
a second n-channel transistor comprising a gate, a source, a drain, and a channel between the source and drain, wherein the channels of the first and second n-channel transistors are electrically connected in series between the output of the first negative resistance device and a second supply voltage,
wherein the gate of the first n-channel transistor is electrically connected to the first input, and wherein the gate of the second n-channel transistor is electrically connected to the second input.

11. The method of claim 6,
wherein the at least two transistors comprise a first n-channel transistor comprising a gate, a source, a drain, and a channel between the source and drain;
wherein the at least two transistors further comprise a second n-channel transistor comprising a gate, a source, a drain, and a channel between the source and drain, wherein the channels of the first and second n-channel transistors are electrically connected in series between the output of the first negative resistance device and a supply voltage,
wherein the gate of the first n-channel transistor is electrically connected to the first input, and wherein the gate of the second n-channel transistor is electrically connected to the second input.

12. The oscillator of claim 1,
wherein the at least two transistors comprise a first p-channel transistor comprising a gate, a source, a drain, and a channel between the source and drain;
wherein the at least two transistors further comprise a second p-channel transistor comprising a gate, a source, a drain, and a channel between the source and drain, wherein the channels of the first and second p-channel transistors are electrically connected in series between the output of the first regeneration device and a first supply voltage, wherein the gate of the first p-channel transistor is electrically connected to the first input, and wherein the gate of the second p-channel transistor is electrically connected to the second input.

13. The oscillator of claim 12, further comprising:

a first n-channel transistor comprising a gate, a source, a drain, and a channel between the source and drain; and a second n-channel transistor comprising a gate, a source, a drain, and a channel between the source and drain, wherein the channels of the first and second n-channel transistors are electrically connected in series between the output of the first regeneration device and a second supply voltage, wherein the gate of the first n-channel transistor is electrically connected to the first input, and wherein the gate of the second n-channel transistor is electrically connected to the second input.

14. The oscillator of claim 1, wherein the at least two transistors comprise a first n-channel transistor comprising a gate, a source, a drain, and a channel between the source and drain;

wherein the at least two transistors further comprise a second n-channel transistor comprising a gate, a source, a drain, and a channel between the source and drain, wherein the channels of the first and second n-channel transistors are electrically connected in series between the output of the first regeneration device and a supply voltage, wherein the gate of the first n-channel transistor is electrically connected to the first input, and wherein the gate of the second n-channel transistor is electrically connected to the second input.

* * * * *